United States Patent
Katoh et al.

(10) Patent No.: US 6,730,970 B1
(45) Date of Patent: May 4, 2004

(54) THIN FILM TRANSISTOR AND FABRICATION METHOD OF THE SAME

(75) Inventors: Tsuyoshi Katoh, Kagoshima (JP); Hideto Motoshima, Kagoshima (JP)

(73) Assignee: NEC LCD Technologies, Ltd., Kawasaki (JP)

( * ) Notice: Subject to any disclaimer, the term of this patent is extended or adjusted under 35 U.S.C. 154(b) by 0 days.

(21) Appl. No.: 09/711,504

(22) Filed: Nov. 14, 2000

(30) Foreign Application Priority Data

Nov. 16, 1999 (JP) .......................................... 11/325739

(51) Int. Cl.⁷ .............................................. H01L 29/78
(52) U.S. Cl. ........................... 257/365; 257/59; 257/72
(58) Field of Search ............................. 257/59, 72, 61, 257/365

(56) References Cited

U.S. PATENT DOCUMENTS

| | | | | |
|---|---|---|---|---|
| 5,567,959 A | * | 10/1996 | Meneji | 257/69 |
| 5,686,976 A | * | 11/1997 | Nishikawa | 349/38 |
| 5,818,070 A | * | 10/1998 | Yamazaki et al. | 257/72 |
| 5,828,430 A | * | 10/1998 | Nishida | 349/44 |
| 5,965,916 A | * | 10/1999 | Chen | 257/347 |
| 6,087,730 A | * | 7/2000 | McGarvey et al. | 257/766 |
| 6,271,540 B1 | * | 8/2001 | Miyamoto et al. | 257/59 |
| 6,285,041 B1 | * | 9/2001 | Noguchi | 257/61 |
| 6,331,476 B1 | * | 12/2001 | Kawakita et al. | 438/486 |
| 6,414,297 B1 | * | 7/2002 | Sasaki et al. | 250/214 R |
| 6,462,723 B1 | * | 10/2002 | Yamazaki et al. | 345/82 |
| 6,534,788 B1 | * | 3/2003 | Yeo et al. | 257/72 |
| 2002/0139978 A1 | * | 10/2002 | Yamazaki et al. | 257/69 |
| 2003/0001832 A1 | * | 1/2003 | Yamazaki et al. | 345/204 |

FOREIGN PATENT DOCUMENTS

| | | | |
|---|---|---|---|
| JP | 3-145627 | * | 6/1991 |
| JP | 4-14261 | * | 1/1992 |
| JP | 4-181779 | * | 6/1992 |
| JP | 6-230425 | * | 8/1994 |
| JP | 10-173195 | | 6/1998 |
| JP | 10-190012 | * | 10/1998 |
| JP | 10-290012 | * | 10/1998 |
| JP | 11-233781 | * | 8/1999 |
| JP | 2000-196093 | * | 7/2000 |

* cited by examiner

Primary Examiner—Nathan J. Flynn
Assistant Examiner—Ahmed N. Sefer
(74) Attorney, Agent, or Firm—McGinn & Gibb, PLLC

(57) ABSTRACT

A voltage of a front channel 42 (gate side wiring) of a thin film transistor is made equal to a voltage of a back channel 44 (liquid crystal alignment side) thereof by electrically connecting a gate electrode 2 and a back channel electrode 82 through a gate contact hole 10 to a semiconductor layer 4 constituting the thin film transistor. The thin film transistor is fabricated through four patterning steps by simultaneously etching the semiconductor layer and a transparent electrode by using a photo resist on the front channel.

13 Claims, 8 Drawing Sheets

THIN FILM TRANSISTOR AND FABRICATION METHOD OF THE SAME

BACKGROUND OF THE INVENTION

1. Field of the Invention

The present invention relates to a thin film transistor and a fabrication method of the same and, particularly, to a thin film transistor for use in an active matrix type liquid crystal display panel and a fabrication method of the same.

2. Description of the Prior Art

Active matrix type liquid crystal display panels have been in great demand recently. To meet the demand, it becomes necessary, in order to improve the producibility thereof, to reduce the number of patterning steps in fabricating thin film transistors. Particularly, it is of urgent necessity to reduce the number of patterning steps without degrading a display quality of a resultant liquid crystal display panel.

In a conventional usual fabrication method of a thin film transistor (TFT), the number of patterning steps of which is reduced, at least 5 (five) patterning steps are required by using at least five kinds of photo resist patterns to be described below, which are used in fabricating a reverse-staggered type TFT. The reverse-staggered type TFT is also referred to as "bottom gate type TFT".

The first one of the five patterning steps is to pattern a gate wiring after an electrically conductive film for gate wiring is formed on a glass substrate.

The second patterning step is to pattern a gate insulating film and a semiconductor layer formed on the gate wiring in the order such that a portion of the semiconductor and an ohmic contact layer, which constitutes a transistor, are selectively provided.

The third patterning step is to pattern a source and drain electrode film to provide source and drain wirings. In this step, a portion of the ohmic semiconductor layer exposed between the source electrode and the drain electrode is etched away.

The fourth patterning step is to form a contact-hole connecting a pixel electrode to either the drain electrode or the source electrode by patterning a nitride passivation film formed on a whole surface of the wafer.

The fifth patterning step is to pattern a transparent pixel electrode film formed on the whole surface of the wafer to provide a transparent pixel electrode.

In this specification, one of the source and drain electrodes, both of which are A. C. driven, connected to the pixel electrode will be referred to as the source electrode and the other will be referred to as the drain electrode.

As mentioned, in the conventional fabrication method of the thin film transistor, at least five patterning steps are required. Furthermore, when a back channel of the TFT is in a floating state and the TFT is operating for a long time, leakage current of the back channel is increased, causing display on a screen of the liquid crystal display panel to be uneven.

SUMMARY OF THE INVENTION

An object of the present invention is to provide a thin film transistor having a structure with which the number of patterning steps with using photo resists can be reduced and a fabrication method of the same thin film transistor.

Another object of the present invention is to provide a thin film transistor capable of reducing leakage current of a back channel when it is operated continuously and a fabrication method of the same thin film transistor.

According to the present invention, a thin film transistor having a back channel electrode is featured by that a voltage of a front channel positioned on the side of a gate wiring of the thin film transistor is made equal to a voltage of the back channel positioned on the side of a back channel electrode by short-circuiting the back channel electrode to a gate electrode through a contact-hole provided in a portion of a semiconductor layer constituting the thin film transistor.

The back channel electrode is featured by that it is formed of a material, which is a material of a pixel electrode such as transparent electrode connected to one of a source electrode and a drain electrode of the thin film transistor.

The contact-hole is preferably formed in a location remote from an active region of the thin film transistor by at least 5 microns.

Furthermore, the present invention is featured by that a passivation film patterned to have a width equal to that of the back channel electrode and the semiconductor layer are provided between the back channel and a gate insulating film.

Moreover, the present invention is featured by that the semiconductor layer patterned to have a width equal to that of the source and drain electrodes of the thin film transistor is provided between the source and drain electrodes and the gate insulating film.

The semiconductor layer is featured by that it has an ohmic contact layer on the side thereof, which is in contact with the source and drain electrodes.

In addition, according to the present invention, a thin film transistor having a semiconductor layer formed on a gate insulating film which is formed on a gate electrode wiring, source and drain wirings formed on the semiconductor layer and a back channel electrode formed on a passivation film which is formed on the source and drain wirings is featured by that a pixel electrode connected to one of the source electrode and the drain electrode is formed of the same material as that of the back channel electrode simultaneously with formation of the back channel electrode, the passivation film patterned to have a pattern identical to that of the back channel electrode and the semiconductor layer are provided between the back channel and a gate insulating film, the back channel electrode and a gate electrode are connected each other through a contact hole penetrating the passivation film, the semiconductor layer and the gate insulating film and the semiconductor layer patterned to have a pattern identical to that of a source and drain wiring layer is provided between the source and drain wiring layer and the gate insulating film.

The thin film transistor is featured by that a side face of one of the source electrode and the drain electrode, which is connected to a pixel electrode, is in contact with the pixel electrode and, further, the whole side face of the one electrode is in contact with the pixel electrode.

According to the present invention, a fabrication method of the above mentioned thin film transistor, which comprises the steps of forming a gate electrode wiring pattern on a substrate, forming a semiconductor layer and source and drain electrodes on a gate insulating film, forming a pixel electrode connected to one of the source electrode and the drain electrode and forming a back channel electrode on a passivation film formed on an active region of the thin film transistor, is featured by comprising the steps of patterning the source and drain electrodes without patterning the semiconductor layer, forming the passivation film after the patterning step, patterning a gate contact hole for connecting the back channel electrode to the gate electrode and an opening portion for the pixel electrode such that the gate contact hole and the opening portion penetrate the passivation film, the semiconductor layer and the gate insulating film, forming an electrically conductive film for the pixel electrode such that the conductive film commonly covers the gate contact hole and the opening portion and patterning the conductive film such that the pixel electrode and the back channel electrode are left as they are, wherein the passivation film and the semiconductor layer, which are not removed, are patterned simultaneously with using the pixel electrode, the back channel electrode and the source and drain electrodes, which are not removed, as a mask.

In this fabrication method, the opening portion is provided by removing a portion of the one of the source electrode and the drain electrode, to which the pixel electrode is connected.

The contact hole is formed in a location remote from the active region of the thin film transistor.

Furthermore, in this fabrication method, a one side of the opening portion is formed such that one side of one of the source electrode and the drain electrode is exposed through the opening portion and is electrically connected to the pixel electrode.

In addition, the semiconductor layer has an ohmic contact layer on the side of the source and drain electrodes and the ohmic contact layer on the active region is patterned simultaneously with the patterning step of the source and drain electrodes.

Moreover, according to the present invention, the fabrication method of the thin film transistor is featured by comprising the first patterning step of forming a first wiring pattern on a substrate, the step of forming a lamination of a first insulating film, a semiconductor layer and a second wiring film on the substrate and the first wiring pattern, the second patterning step of patterning the second wiring film to form a predetermined wiring pattern, the step of forming a second insulating film commonly on the lamination and the second wiring pattern, the third patterning step of simultaneously forming a gate contact hole for exposing a portion of the first wiring pattern through the second insulating film and an opening portion for a pixel electrode for exposing a portion of the substrate through the second insulating film, the step of forming a transparent electrode and the fourth patterning step of forming a transparent pixel electrode by patterning the transparent electrode and, simultaneously therewith, defining a semiconductor region by selectively etching the semiconductor layer by using a resist mask on the transparent electrode and the second wiring pattern as an etching resist mask.

BRIEF DESCRIPTION OF THE DRAWINGS

The above mentioned and other objects, features and advantages of the present invention will become more clear by referring to the following detailed description of the invention taken in conjunction with the accompanying drawings, in which.

DETAILED DESCRIPTION OF THE PREFERRED EMBODIMENTS

Preferred embodiments of the present invention will be described in detail with reference to the drawings.

Figure 1:
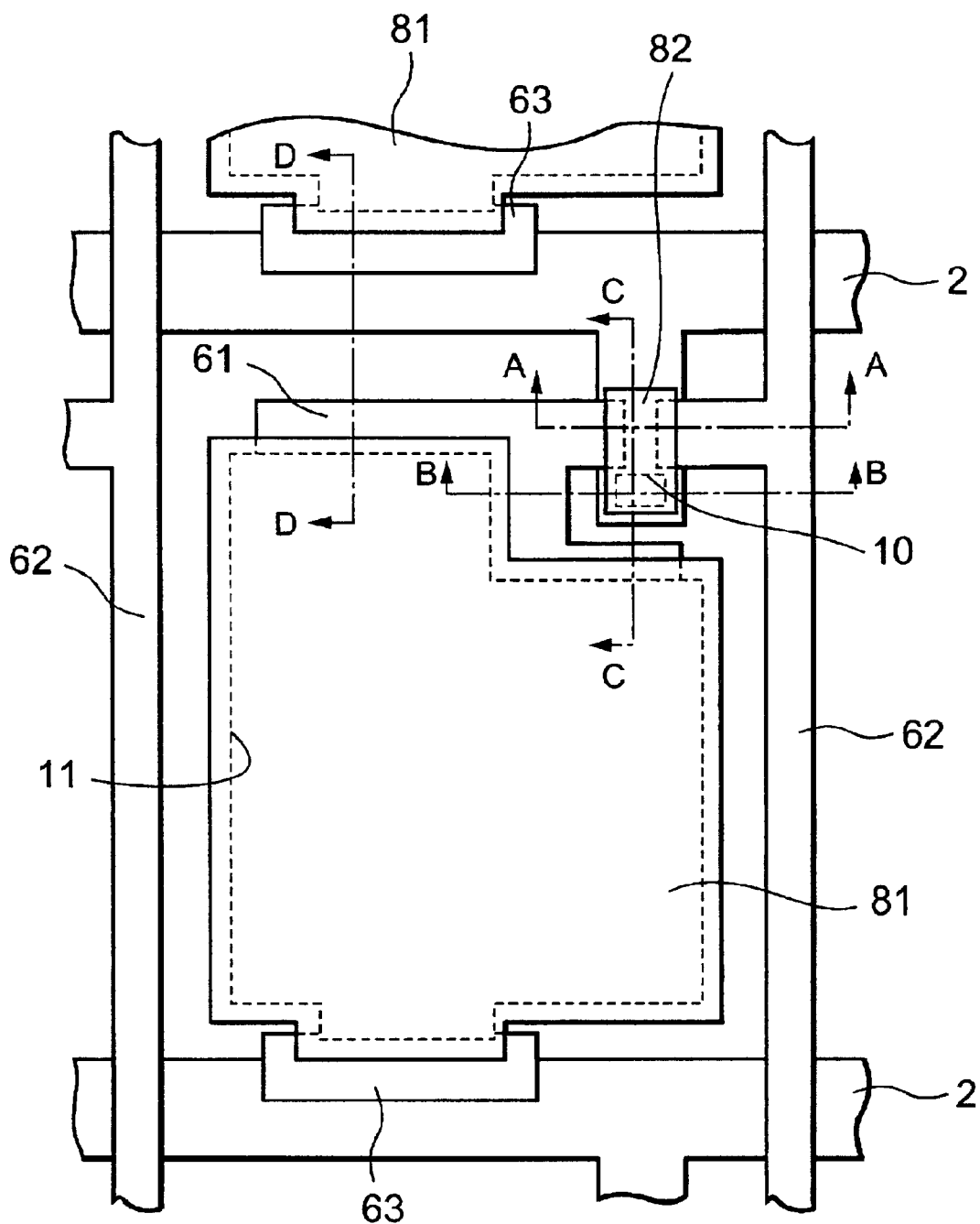
FIG. 1 is a plan view of one pixel region of a TFT according to the present invention.

FIG. 1 is a plan view of one pixel region of a TFT substrate according to an embodiment of the present invention and cross sections taken along lines A—A, B—B, C—C and D—D are shown in FIGS. 2, 3, 4 and 5, respectively.

The present TFT substrate for use in such as a liquid crystal display panel includes a transparent insulating substrate 1 in the form of such as a glass plate, a gate electrode 2 of an electrode material such as Cr (Chromium), W (Tungsten), Ta (Tantalum) or Al (Aluminum) formed on a surface of the transparent substrate 1, a gate insulating film 3 of an insulating material such as silicon nitride formed on the gate electrode 2, a semiconductor layer 4 of such as non-doped amorphous silicon (a—Si) formed on the gate insulating film 3 and an ohmic contact layer 5 of $n^+$ a—Si doped with n type impurity such as phosphor formed on the semiconductor layer 4.

Figure 2:
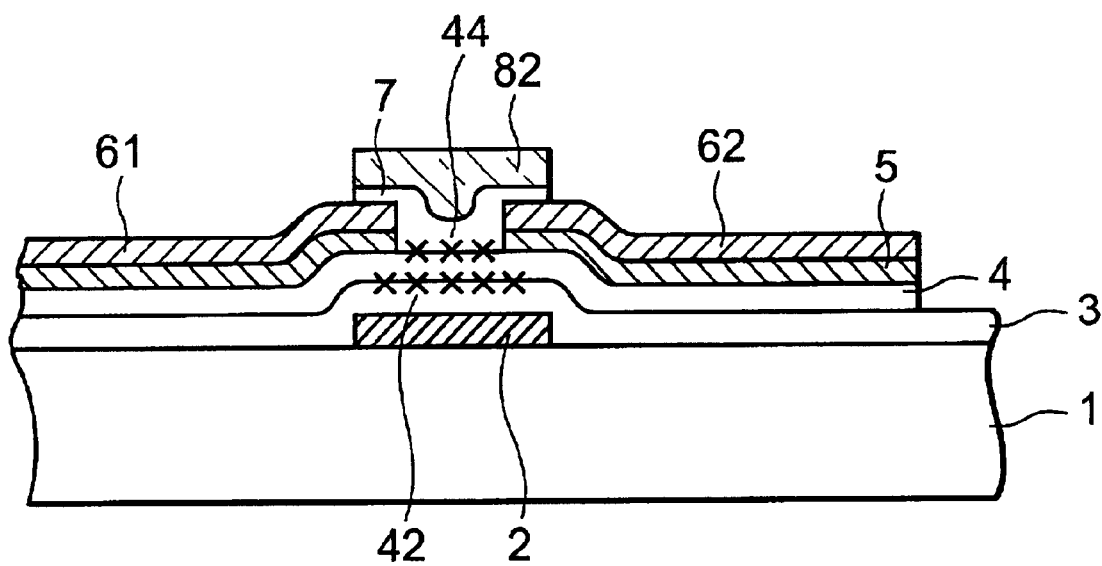
FIG. 2 is a cross section taken along a line A—A in FIG. 1.

As shown in FIG. 2, in a transistor region, a portion of the ohmic contact layer 5, which is on a channel region positioned between source electrode 61 and drain electrode 62, is removed to form an active region of the transistor. Furthermore, a silicon nitride film as a passivation film 7 and a back channel electrode 82 are successively formed on the gate electrode. The back channel electrode 82 is made of a transparent electrode layer of such as ITO (Indium Tin Oxide) and thus it can be patterned simultaneously with a patterning of a pixel electrode 81 of ITO.

Figure 3:
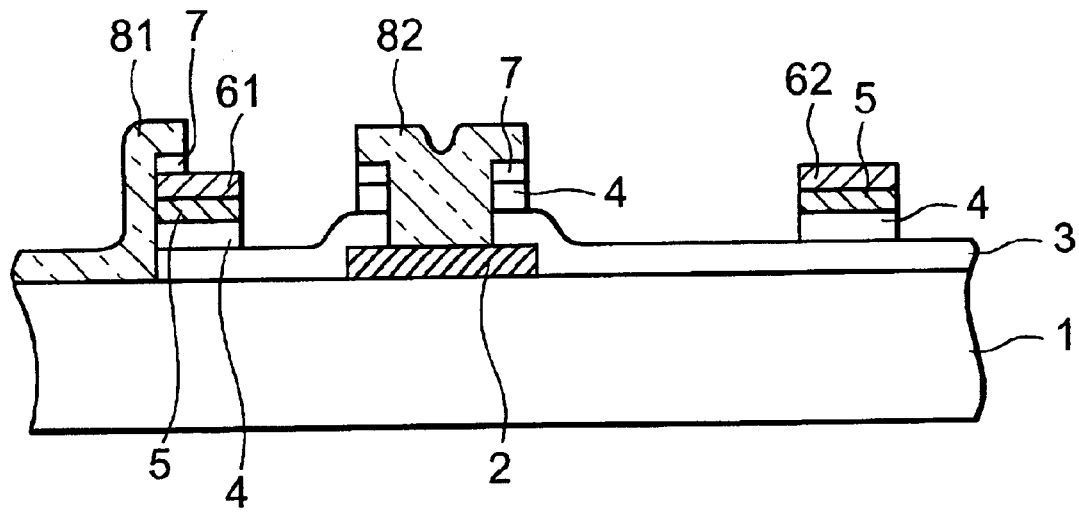
FIG. 3 is a cross section taken along a line B—B in FIG. 1.
Figure 4:
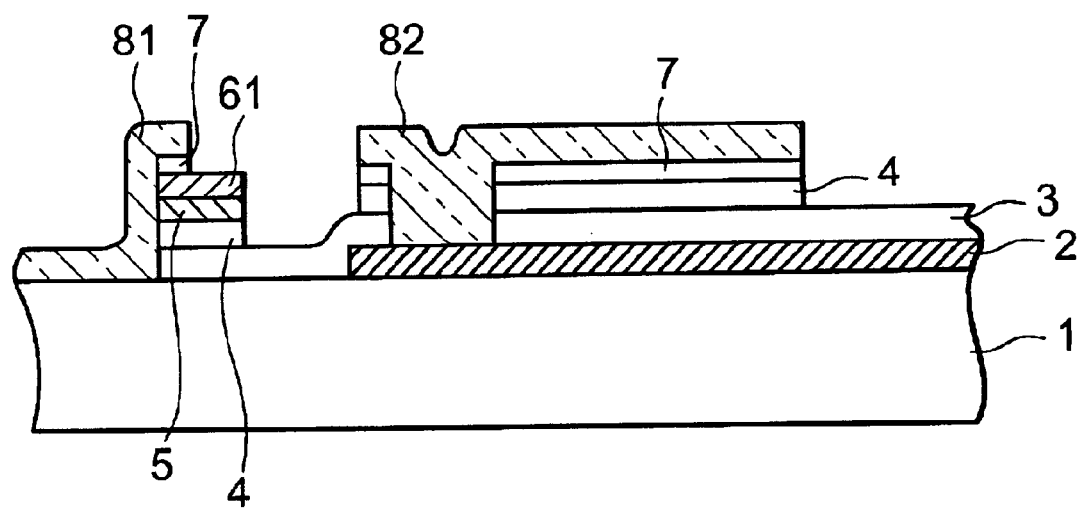
FIG. 4 is a cross section taken along a line C—C in FIG. 1.
Figure 5:
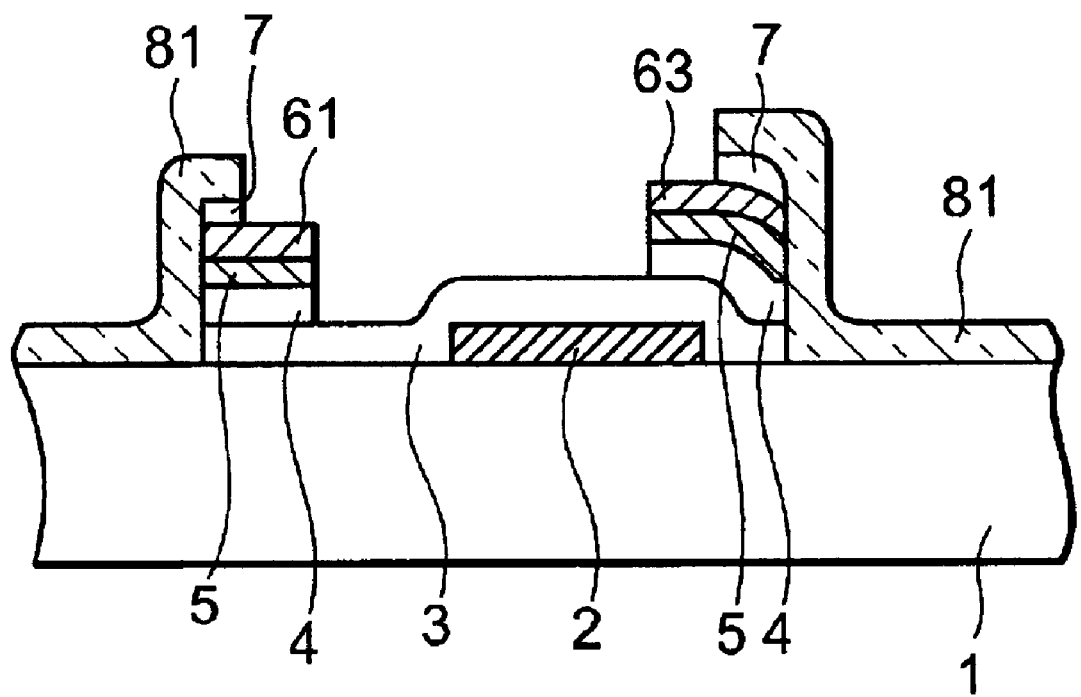
FIG. 5 is a cross section taken along a line D—D in FIG. 1.

In the present invention, the back channel electrode 82 is electrically connected to the gate electrode 2 through a gate contact hole 10 as shown in FIGS. 3 and 4 such that the back channel electrode 82 does not become in a floating state.

The contact hole 10 is patterned such that it is separated from the channel active region layer by a sufficient distance (at least 5 $\mu$m) and is positioned on a gate wiring. That is, as shown in FIGS. 3 and 4, the gate electrode 2 is exposed through the passivation film 7, the semiconductor layer 4 and the gate insulating film 2. At a time when the gate contact hole 10 is formed, an opening 11 corresponding to a region of the pixel electrode 81 is formed by etching the passivation film 7, the semiconductor layer 4 and the gate insulating film 2 to expose the substrate 1 (see FIG. 7B). Then, the back channel electrode 82 is formed simultaneously with the formation of the pixel electrode 81. The TFT substrate of the present invention is formed by etching away the semiconductor layer 4 left between the source and drain wiring regions and the back channel electrode simultaneously with the patterning of the transparent pixel electrode and the back channel electrode.

By employing such construction, a front channel 42 (on the side of the gate wiring) and a back channel 44 (on the side of liquid crystal alignment) become equipotential when the thin film transistor is operating, as shown in FIG. 2.

A storage capacity region is formed between the pixel electrode and the gate electrode. In the present invention, however, a storage capacity can be formed between the transparent pixel electrode 81 and the gate electrode 2 with the gate insulating film 3 interposed therebetween since the transparent pixel electrode 81 is electrically connected to the storage capacity electrode 63 by forming the electrode 63 of the same material as that of the source and drain electrodes simultaneously with the formation of the source and drain electrodes 61 and 62.

In the present invention, the transparent pixel electrode 81 is electrically connected to one of the source electrode and the drain electrode, which is connected to the pixel electrode, that is, the side face of the source electrode 61, as shown in FIGS. 3 and 4. In order to increase the contact area of the transparent pixel electrode 81 and the side face of the source electrode to thereby reduce the electric resistance, the source electrode 61 is patterned to a crank shape as shown in FIG. 1 so that all sides of the source electrode 61 becomes in contact with the transparent pixel electrode 81. As described, in the construction in which the side face of the source or drain electrode is in contact with the pixel electrode, it is preferable that the side face has a crank shape so that the whole side face area contacts with the pixel electrode to reduce electric resistance.

In the shown example, when the opening portion 11 is formed, one side of the source electrode 61 is etched away to expose the side face of the source electrode 61. However, if the passivation film 7 can be etched away such that the side face of the source electrode on the side of the pixel electrode, it is possible to electrically connect the transparent pixel electrode 81 to the source electrode 61 without removing the one side of the source electrode 61 by etching.

Now, the fabrication method of thin film transistor according to the present invention will be described every patterning step.

Figure 6A:
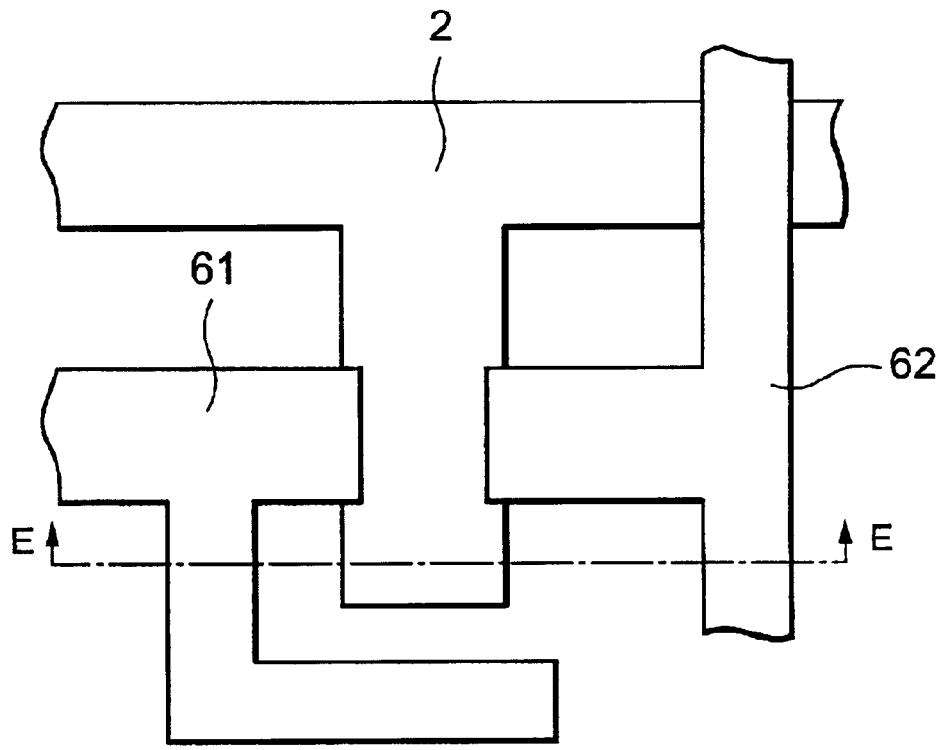
FIG. 6A is a plan view showing a step of a fabrication method of the TFT shown in FIG. 1.

The first patterning step includes the steps of forming a metal film of Cr, W, Ta or Al having thickness of 100 nm~300 nm on the substrate 1 by such as sputtering and etching the metal film to form the gate wiring pattern 2 shown in FIG. 6A by photolithography.

The second patterning step includes the steps of forming the gate insulating film 3 of such as silicon nitride 200 nm~600 nm thick, forming the semiconductor layer 5 of such as non-doped a—Si 100 nm~400 nm thick and the ohmic contact layer 5 of such as n⁺ a—Si 10 nm~100 nm thick in the order by such as plasma CVD, and the steps of forming a metal film of such as Cr. W, Ta or Al 50 nm~100 nm thick by such as sputtering and patterning the metal film to form the source wiring 61 and the drain wiring 62 as shown in FIG. 6A and etching away an ohmic semiconductor layer of the ohmic contact layer 5 exposed on the surface of the wafer, which is in the back channel region (see FIG. 2).

Figure 6B:
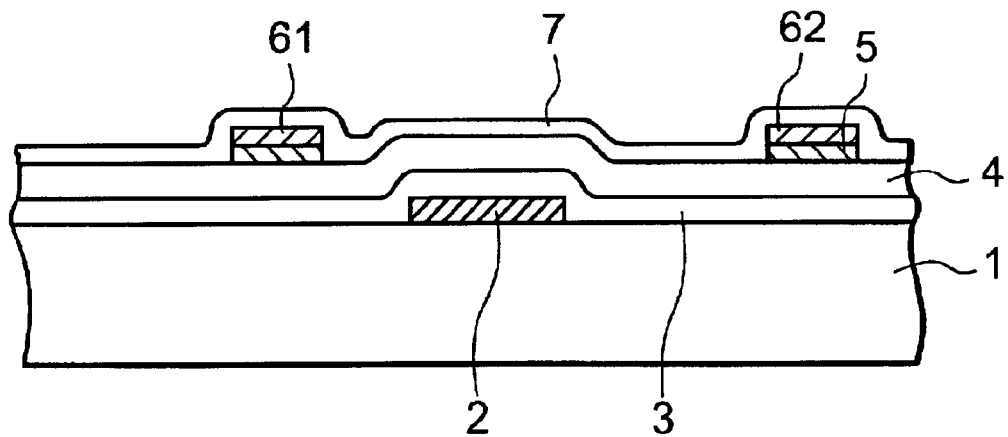
FIG. 6B is a cross section taken along a line E—E in FIG. 6A.
Figure 7A:
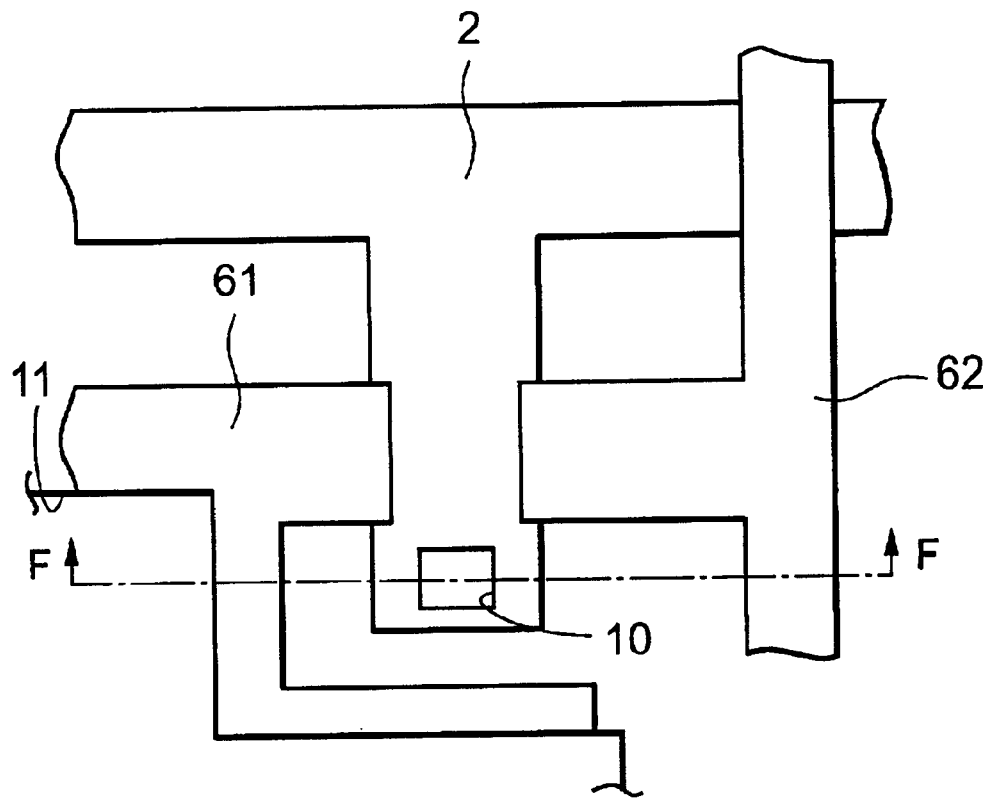
FIG. 7A is a plan view showing another step of the fabrication method of the TFT shown in FIG. 1.
Figure 7B:
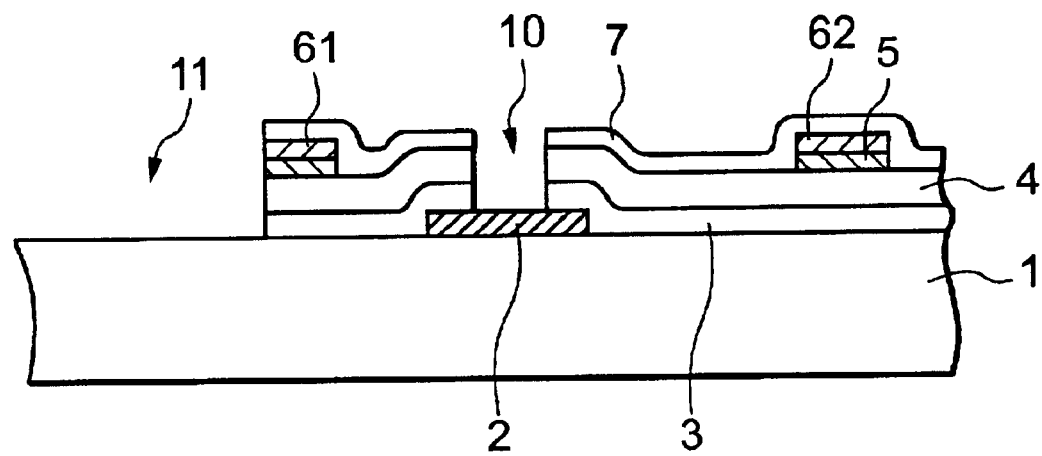
FIG. 7B is a cross section taken along a line F—F in FIG. 7A.

The third patterning step includes the step of forming the passivation film 7 of such as silicon nitride 100 nm~300 nm thick on the whole surface of the wafer by such as plasma CVD (see FIG. 6B), etching a portion of the passivation film 7, which is located on the gate wiring and remote from the active layer by at least 5 microns, down to the gate electrode and, simultaneously, etching the pixel portion down to the substrate 1 as shown in FIGS. 7A and 7B. In this stage, portions of the semiconductor layer in other region than the region in which the contact etching is performed are left as it is.

The fourth patterning step includes the steps of forming a transparent electrode layer of such as ITO 40 nm~100 nm thick on the whole surface of the uppermost layer of the wafer by such as sputtering, patterning the transparent electrode layer to form the transparent pixel electrode 81 and the transparent electrode 82 and, in the transparent electrode patterning step, selectively removing the passivation film 7, the ohmic contact layer 5 and the semiconductor layer 4 with using a resist mask on the transparent electrodes and the wiring electrodes as an etching mask to define the semiconductor active region as shown in FIG. 3.

In the fourth patterning step, it is necessary to select metal materials having selectivity to the identical etching step as the materials of the transparent electrode, the source electrode 61 and the drain electrode 62. As an example, the source and drain wirings 61 and 62 may be formed of Cr and the transparent electrode may be formed of ITO. In such case, ITO can be patterned by wet etching using iron chloride group or dry etching using HI or HBr gas, while the underlying Cr can not be etched unless wet etching using strong oxidizing Ce (Cerium) or dry etching using chlorine containing gas is used.

The TFT shown in FIG. 1 is completed through the above mentioned-four patterning steps. Therefore, in the present invention, the number of patterning steps is reduced, so that the fabrication method can be substantially simplified.

The materials of the etching masks used in the four patterning steps are not limited to specific material and may be any known organic photo resists. The etching method for the gate electrode may be a wet etching and a dry etching using fluorine containing gas may be effective for the ohmic contact layer, the semiconductor layer and the passivation film. Preferably, plasma etching is used for the ohmic contact layer and reactive etching is used for the semiconductor layer and the passivation film.

Figure 8:
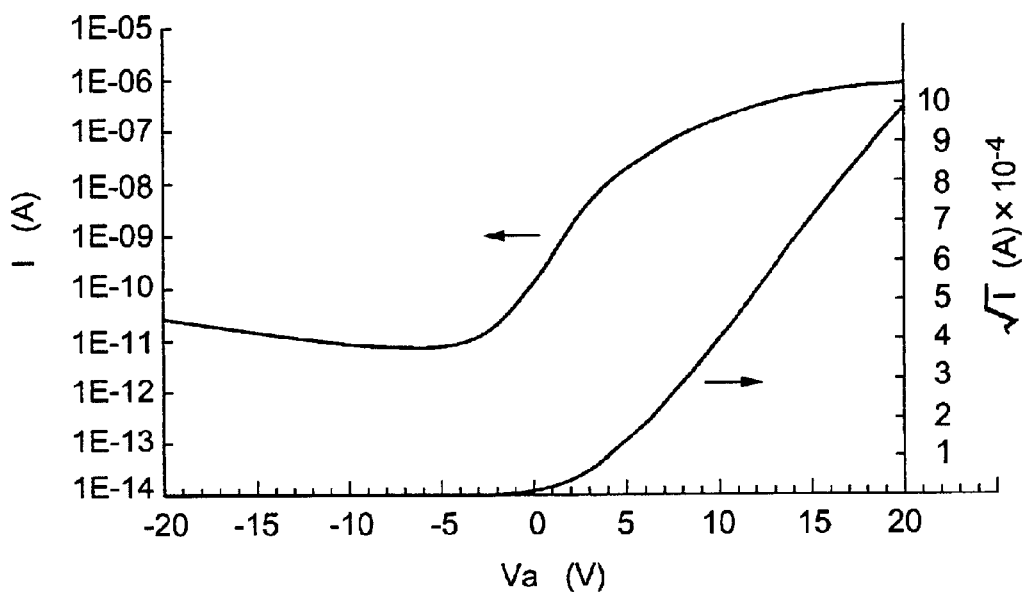
FIG. 8 shows characteristics of a TFT obtained by a conventional fabrication method.
Figure 9:
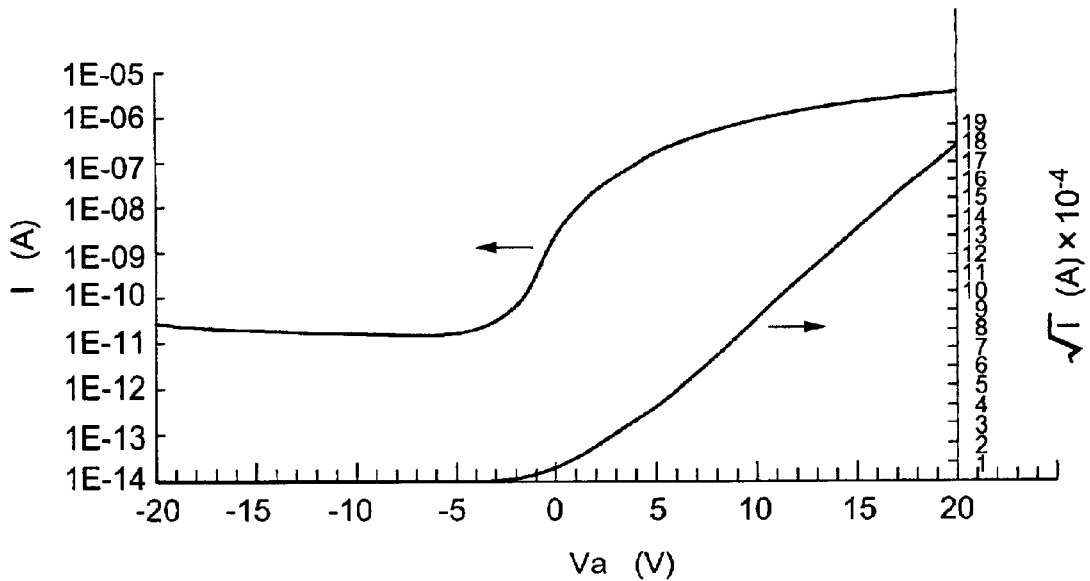
FIG. 9 shows a characteristics of a TFT obtained by the fabrication method according to the present invention.

FIG. 8 shows a characteristics of a TFT fabricated through the conventional five patterning steps and FIG. 9 shows a characteristics of the TFT according to the present invention, in each of which a left side ordinate depicts current I (A) flowing through the transistor and abscissa indicates voltage Va in a range from −20V to +20V applied to the gate wiring, when a voltage Vb=+10V is applied to the drain wiring. The right side ordinate vI (A) indicates the linearity of the current characteristics of the TFT.

The current was measured with the back side surface of the TFT, that is, the surface of the back channel 82 being illuminated with light. Comparing the characteristics of the present TFT with the characteristics of the conventional TFT, it is clear that the current of the present TFT in a range of Va from −20V to −5V is larger than 1E-11 (=1×10⁻¹¹) and stands comparison with that of the conventional TFT. It is natural that the current value in such voltage range is reduced since both the front channel 42 and the back channel 44 are controlled through the gate wiring as shown in FIG. 2. In the present TFT, however, the back channel electrode is transparent. Therefore, the current is prevented from being reduced by light incident on the back channel side of the TFT when the measurement is performed.

It is also clear that the current flowing through the TFT with the voltage Va in the rage from +5V to +20V is about three times that flowing through the conventional TFT. This phenomenon may be due to the fact that, while electrons flow in the front channel 42 shown in FIG. 2 in the conventional TFT, electrons flow through both the front channel 42 and the back channel 44 in the present invention, so that the current characteristics may be improved. However, true reason for such large current flowing through the present TFT is not clear so far.

As such, Ion/Ioff characteristics, that is, (transistor ON)/(transistor OFF) characteristics, of the present TFT is substantially improved and the TFT can be fabricated with the reduced number of the photo resist patterning steps compared with the conventional TFT.

Although the present invention has been described with reference to the reverse-staggered TFT, it is of course possible to apply the present invention to a staggered TFT, which is also referred to as "top gate type TFT".

Figure 10:
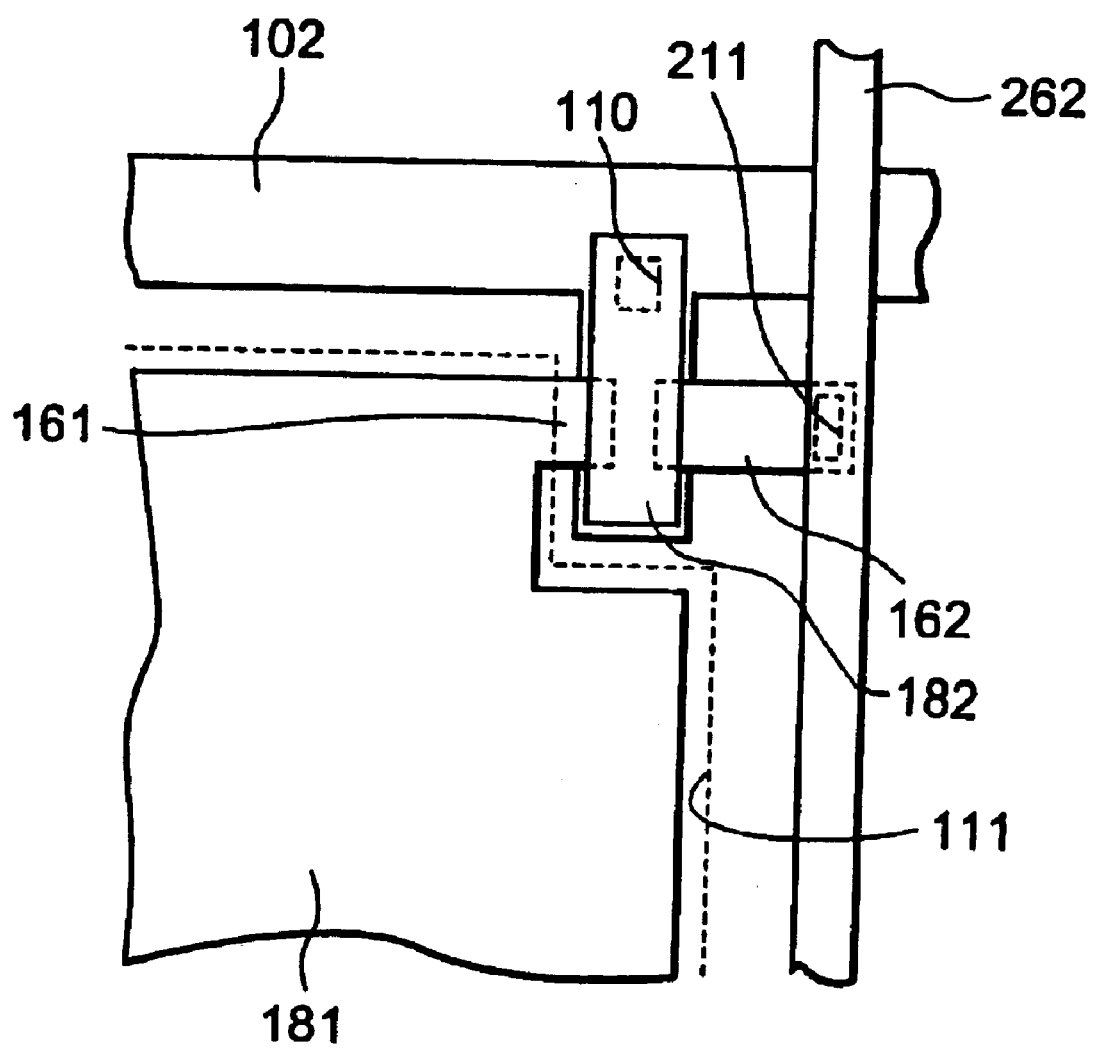
FIG. 10 is a plan view of another embodiment of the present invention.

Describing the case where the present invention is applied to the top gate type TFT with reference to FIG. 10, the first patterning step includes the step of forming a wiring 102 for a light shielding film, which becomes the back channel, on the substrate surface.

The second patterning step includes the step of forming the transparent electrode film after the insulating film is formed and patterning a pixel electrode 181 and a source and drain electrodes 161 and 162.

The third patterning step includes the step of forming a semiconductor layer and a gate insulating film successively and forming an opening portion 111 for exposing a pixel electrode on a portion which becomes a pixel portion and a light shielding film, a gate contact-hole 110 and a contact-hole 211 to the drain electrode.

The fourth patterning step includes the step of forming a metal film, which becomes a front channel and a drain wiring, patterning the metal film to form the drain wiring 262 and a front channel 182 and etching a semiconductor layer by using the front channel 182 and the drain wiring 262 as a mask.

In the above description of the top gate type TFT, the formation of the ohmic contact layer is omitted. However, the technique for forming the ohmic contact layer selectively in only an interface between a transparent electrode formed of ITO and a semiconductor layer formed thereon has been known. Therefore, by utilizing such known technique, it is possible to form an ohmic contact layer without requiring a new mask pattern.

Although only the features of the substrate portion of the present TFT have been described, a color filter layer and an aligning film are of course provided on the side of the TFT substrate, which is in contact with liquid crystal, by known technology.

According to the present invention featured by etching the semiconductor layer by using the electrodes on the back channel or the front channel as a mask, the following advantages are obtained:

(a) A TFT can be fabricated through four photo resist patterning steps.

(b) The front channel and the back channel can be ONed/OFFed by a signal from the gate wiring, resulting a reduction of the back channel leakage current when the TFT is operated continuously.

(c) Although it is necessary to remove an electrostatic protection circuit by reduction of the number of patterning steps, the circuit itself becomes similar to the conventional circuit since it is possible to connect the gate or drain by the transparent electrode after the contact is formed.

(d) Since the pixel electrode is formed in the uppermost layer, there is no reduction of the aperture ratio even when the number of photo resist patterning steps.

Although the present invention has been described with reference to specific embodiments, this description is not meant to be construed in a limiting sense. Various modifications of the described embodiments will becomes apparent to persons skilled in the art upon reference to the description of the invention. It is therefore contemplated that the appended claims will cover any modifications or embodiments as fall within the true scope of the invention.

What is claimed is:

1. A thin film transistor including:
   a back channel electrode,
   wherein a voltage of a front channel positioned on the side of a gate wiring of said thin film transistor is made equal to a voltage of said back channel positioned on the side of a back channel electrode by short-circuiting said back channel electrode to a gate electrode through a contact-hole provided in a portion of semiconductor layer forming said thin film transistor.

2. A thin film transistor as claimed in claim 1, wherein said back channel electrode is formed of the same material as a material of a pixel electrode connected to one of source and drain electrodes of said thin film transistor.

3. A thin film transistor as claimed in claim 2, wherein said pixel electrode is a transparent electrode.

4. A thin film transistor as claimed in claim 1, wherein said semiconductor layer has an ohmic contact layer on the side thereof, which is in contact with source and drain electrodes.

5. A thin film transistor as claimed in claim 1, wherein said portion of said semiconductor layer forming said thin film transistor contact-hole for short-circuiting said back gate electrode ands said gate electrode comprises an active layer.

6. A thin film transistor including:
   a back channel electrode,
   wherein a voltage of a front channel positioned on the side of a gate wiring of said thin film transistor is made equal to a voltage of said back channel positioned on the side of a back channel electrode by short-circuiting said back channel electrode to a gate electrode through a contact-hole provided in a portion of a semiconductor layer forming said thin film transistor, and
   wherein said contact-hole is formed in a location remote from an active region of said thin film transistor by at least five microns.

7. A thin film transistor including:
   a back channel electrode,
   wherein a voltage of a front channel positioned on the side of a gate wiring of said thin film transistor is made equal to a voltage of said back channel positioned on the side of a back channel electrode by short-circuiting said back channel electrode to a gate electrode through a contact-hole provided in a portion of a semiconductor layer forming said thin film transistor, and
   wherein a passivation film patterned to have a width equal to that of said back channel electrode and said semiconductor layer are provided between said back channel and a gate insulating film.

8. A thin film transistor including:
   a back channel electrode, wherein a voltage of a front channel positioned on the side of a gate wiring of said thin film transistor is made equal to a voltage of said back channel positioned on the side of a back channel electrode by short-circuiting said back channel electrode to a gate electrode through a contact-hole provided in a portion of semiconductor layer forming said thin film transistor, and wherein said semiconductor layer patterned to have a width equal to that of source and drain electrodes of said thin film transistor is provided between said source and drain electrodes and a gate insulating film.

9. A thin film transistor including a back channel electrode, wherein a voltage of a front channel positioned on the side of a gate wiring of said thin film transistor is made equal to a voltage of said back channel positioned on the side of a back channel electrode by short-circuiting said back channel electrode to a gate electrode through a contact-hole provided in a potion of a layer forming said thin film transistor, and wherein said contact-hole is formed in a location remote from an active region of said thin film transistor by at least five microns.

10. A thin film transistor including a back channel electrode, wherein a voltage of a front channel positioned on the side of a gate wiring of said thin film transistor is made equal to a voltage of said back channel positioned on the side of a back channel electrode by short-circuiting said back channel electrode to a gate electrode through a contact-hole provided in a portion of a layer forming said thin film transistor, and wherein a passivation film patterned to have a width equal to that of said back channel electrode and said layer are provided between said back channel and a gate insulating film of said film transistor.

11. A thin film transistor including:

a back channel electrode, wherein a voltage of a front channel positioned on the side of a gate wiring of said thin film transistor is made equal to a voltage of said back channel positioned on the side of a back channel electrode by short-circuiting said back channel electrode to a gate electrode through a contact-hole provided in a portion of a semiconductor layer forming said thin film transistor, and wherein said layer patterned to have a width equal to that of source and drain electrodes of said thin film transistor is provided between said source and drain electrodes and a gate insulating film of said film transistor.

12. A thin film transistor including:

a back channel electrode, wherein a voltage of a front channel positioned on the side of a gate wiring of said thin film transistor is made equal to a voltage of said back channel positioned on the side of a back channel electrode by short-circuiting said back channel electrode to a gate electrode through a contact-hole provided in a portion of a semiconductor layer forming said thin film transistor, and wherein said layer has an ohmic contact layer on the side thereof, which is in contact with source and drain electrodes of said film transistor.

13. A thin film transistor as claimed in claim 12, wherein said portion of said semiconductor layer forming said thin film transistor contact-hole for short-circuiting said back gate electrode ands said gate electrode comprises an active layer.

* * * * *